United States Patent [19]

Hush et al.

[11] Patent Number: 5,657,289
[45] Date of Patent: Aug. 12, 1997

[54] EXPANDABLE DATA WIDTH SAM FOR A MULTIPORT RAM

[75] Inventors: Glen E. Hush; Mark R. Thomann, both of Boise, Id.

[73] Assignee: Micron Technology, Inc., Boise, Id.

[21] Appl. No.: 511,778

[22] Filed: Aug. 30, 1995

[51] Int. Cl.⁶ ........................................................ G11C 8/00
[52] U.S. Cl. ................ 365/230.05; 365/219; 365/230.09
[58] Field of Search ............................ 365/230.05, 219, 365/230.09, 239

[56] References Cited

U.S. PATENT DOCUMENTS

| 4,825,411 | 4/1989 | Hamano | 365/219 |
| 4,891,794 | 1/1990 | Hush et al. | 365/189.04 |
| 5,282,177 | 1/1994 | McLaury | 365/230.05 |
| 5,473,566 | 12/1995 | Rao | 365/230.05 |

FOREIGN PATENT DOCUMENTS

| 0378195 | 7/1990 | European Pat. Off. . |
| 0580085 | 1/1994 | European Pat. Off. . |

Primary Examiner—David C. Nelms
Assistant Examiner—Huan Hoang
Attorney, Agent, or Firm—Schwegman, Lundberg, Woessner & Kluth, P.A.

[57] ABSTRACT

A multiport memory is described which includes a random access memory (RAM) and serial access memories (SAMs). The multiport memory is well suited for storing asynchronous transfer mode (ATM) data cells. Control circuitry is provided to allow the multiport memory to be easily configured for operating at different input data rates. This is accomplished by configuring several of the SAMs to store a portion of an input ATM cell on an input clock cycle. The full ATM cell is stored in less clock cycles and can be transferred from the SAMs to the RAM in a single transfer cycle.

8 Claims, 10 Drawing Sheets

EXPANDABLE DATA WIDTH SAM FOR A MULTIPORT RAM

TECHNICAL FIELD OF THE INVENTION

The present invention relates generally to multiport memories and in particular the present invention relates to multiport memories having expandable data rate inputs for serial access memories (SAMs).

BACKGROUND OF THE INVENTION

In general, multiport memories refer to memory circuits which include both a random access memory (RAM) and serial access memories (SAMs). The SAMs are used to receive data input and transfer the data to the RAM. SAMs are also used to retrieve data from the RAM and output the data from the memory circuit. Multiport memories can be used as network switches. That is, the general increase in network traffic requires fast, efficient methods of managing traffic and congestion. One problem area in network traffic management occurs at line switching where a switch is used to route data from one set of communication lines to another set of communication lines. Network switches can comprise a multiport memory which is used to temporarily store a transmission during the switching operation. These switches are particularly useful in asynchronous transfer mode (ATM) communication systems.

A simplified block diagram of a multi-port memory 90 shown in FIG. 1 can be used for asynchronous transfer mode (ATM) networks. The memory has a random access memory (RAM) 92 and eight input serial access memories (SAMs) 94(0)–(7) and eight output SAMs 96(0)–(7). ATM communication packages, or cells, flow through input ports into the input SAM's. The ATM cells are transferred to the RAM and then eventually transferred to the output SAM's where the ATM cells are output on communication lines via output ports. ATM cells are a fixed length of data bits which are transmitted in an asynchronous manner. While the data length is the same for each ATM cell, the data rate of transmission can vary between networks.

Each input SAM of the multiport memory of FIG. 1 can receive one bit of an ATM cell on an input clock cycle. The input data rate of the multiport memory is therefore limited by the speed of the input clock. Memory circuit design constraints currently prohibit operating the input clocks at speeds which are needed to achieve upper limit data rates for ATM transmissions. The width of input data, therefore, must be increased to increase the data input rate. That is, by inputting data in a parallel manner, the input data rate can be increased. As such, multiport memories can be specifically designed to operate at a given input data rate. The memory circuits, however, are specifically made for a given operation and are therefore not useful in systems operating at a different data rate.

For the reasons stated above, and for other reasons stated below which will become apparent to those skilled in the art upon reading and understanding the present specification, there is a need in the art for an adjustable data width multiport memory circuit which can be easily configured to operated at a number of different data rates.

SUMMARY OF THE INVENTION

The above mentioned problems with multiport memories and other problems are addressed by the present invention and which will be understood by reading and studying the following specification. A multiport memory is described which includes SAMs that can be configured to expand the data width and consequently the data rate. The memory is adaptable to a variety of communication networks having different data transmission rates.

In particular, the present invention describes a multiport memory circuit having an adjustable data width comprising a random access memory (RAM) array, a plurality of serial access memories (SAMs) coupled to the RAM and having a plurality of data memory cells for storing data. Each one of the plurality of SAMs is capable of storing a full data package of a predetermined length. The memory also includes a controller for configuring the plurality of SAMs to store a portion of a full data package of a predetermined length.

The multiport memory can further include a decode circuit coupled to the plurality of SAMs for selectively accessing the plurality of data memory cells. In another embodiment, the multiport memory further includes a counter coupled to the decode circuit for providing input data to the decode circuit. Further, the memory can include a transfer circuit for selectively coupling the plurality of data memory cells of each of the plurality of SAMs which store a portion of the full data package of a predetermined length. A clock circuit can be included in the memory for providing a synchronized input clock to the plurality of SAMs.

In another embodiment, a method is described for operating a multiport memory comprising a random access memory (RAM) array and a plurality of serial access memories (SAMs). The method comprises the steps of selecting a data width mode using a controller of the multiport memory, and configuring the plurality of SAMs for storing a portion of an input data package.

In another embodiment, the multiport memory comprises N SAMs, and the each SAM stores 1/N of the input data package. Further, in another embodiment, the method can include the step of storing N bits of the data package in the N SAMs on one input clock signal.

In yet another embodiment, a method is described for storing a data package in a multiport memory comprising a random access memory (RAM) array and a plurality of serial access memories (SAMs). The method comprises the steps of selecting a data width mode using a controller of the multiport memory, configuring the plurality of SAMs for storing a portion of an input data package, storing a portion of the data package in each of the plurality of SAMs, and transferring the portions of the data package from the plurality of SAMs to the RAM in one transfer cycle.

3

Figure 8:
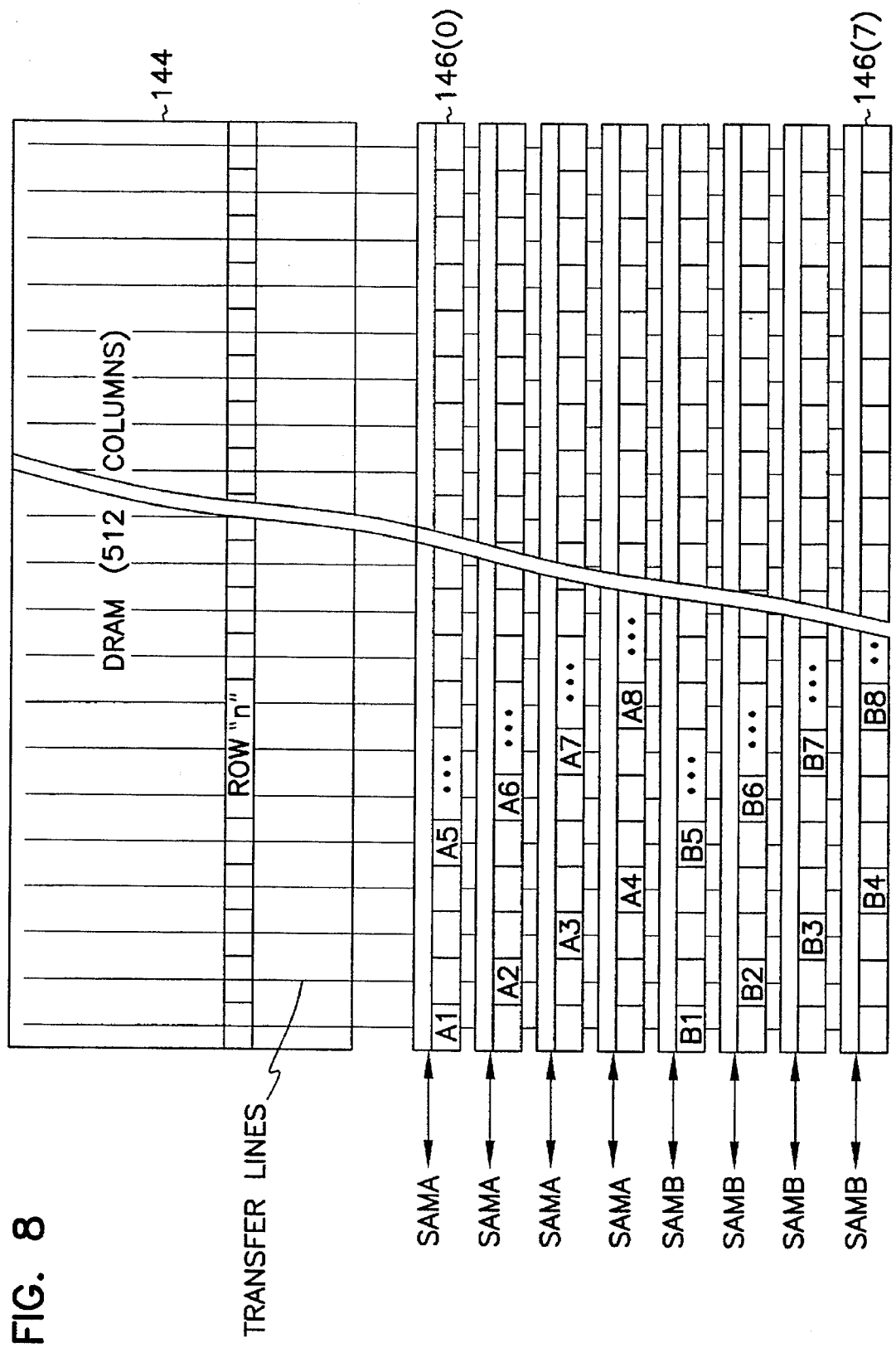
Figure 9:
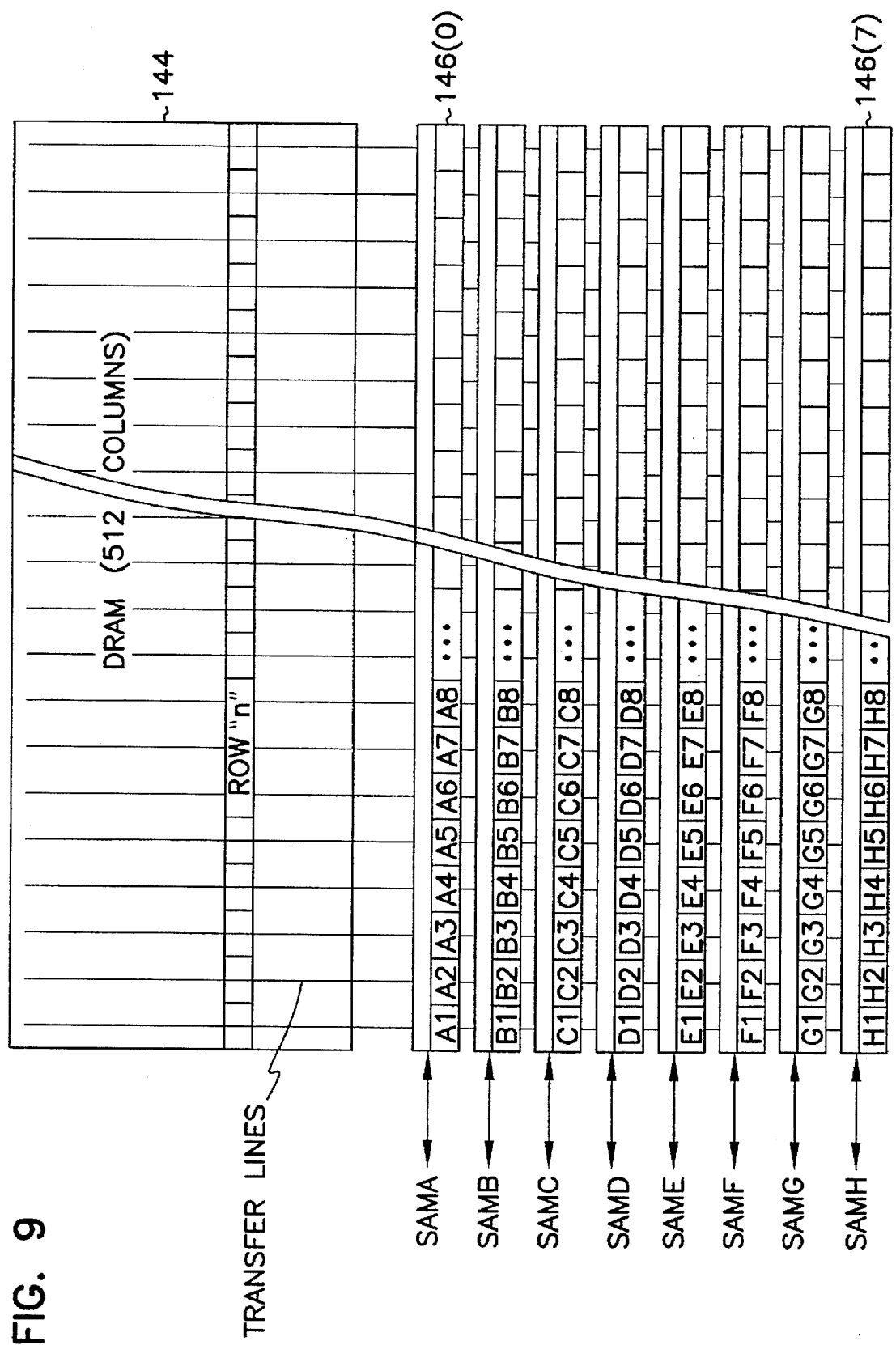
Figure 10:
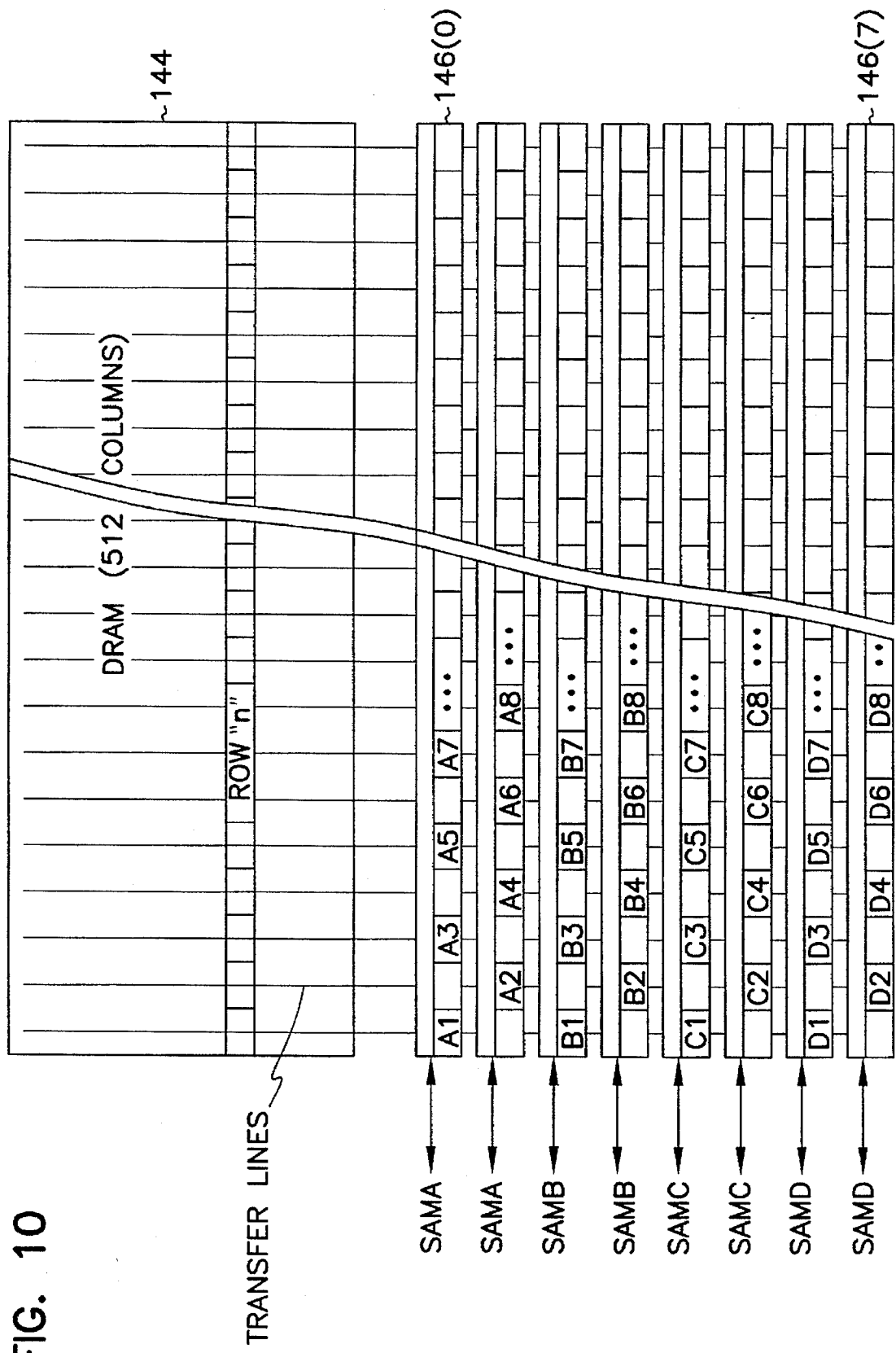
Figure 11:
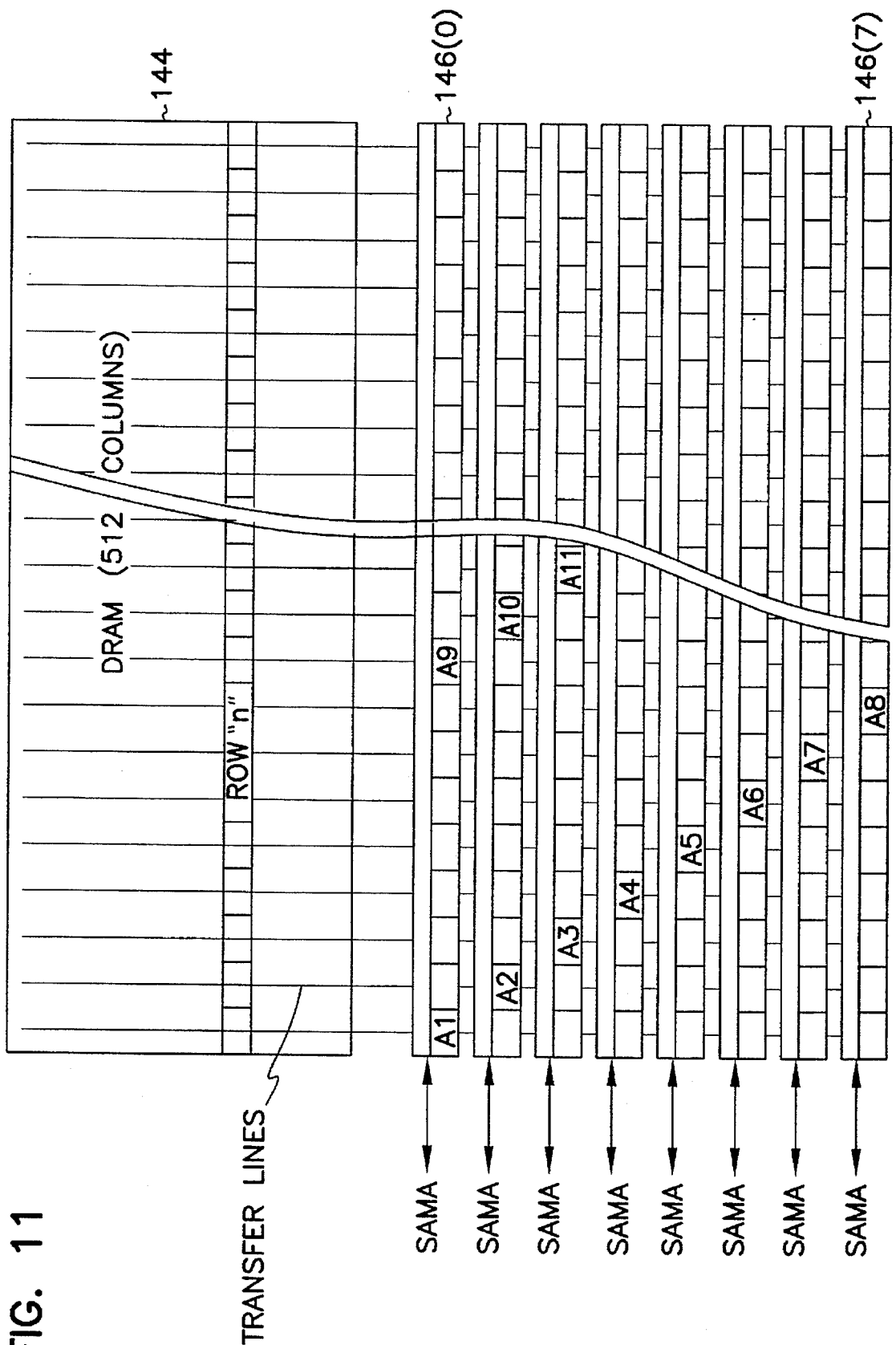

FIG. 8 is a simplified block diagram of an extended data width memory where four SAMs are used to store an ATM cell;

FIG. 9 is a simplified block diagram of an extended data width memory where one SAM is used to store an ATM cell;

FIG. 10 is a simplified block diagram of an extended data width memory where two SAMs are used to store an ATM cell; and FIG. 11 is a simplified block diagram of an extended data width memory where eight SAMs are used to store an ATM cell.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
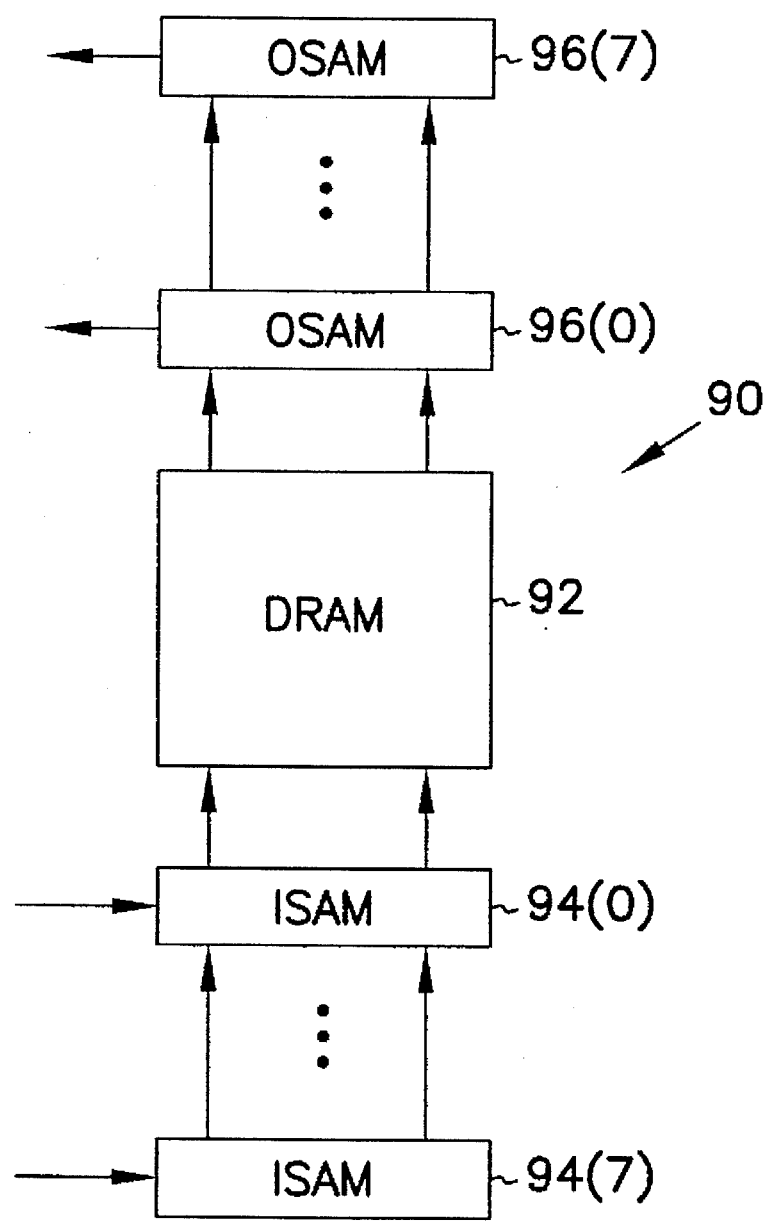
FIG. 1 is a simplified block diagram of a multi-port memory.
Figure 2:
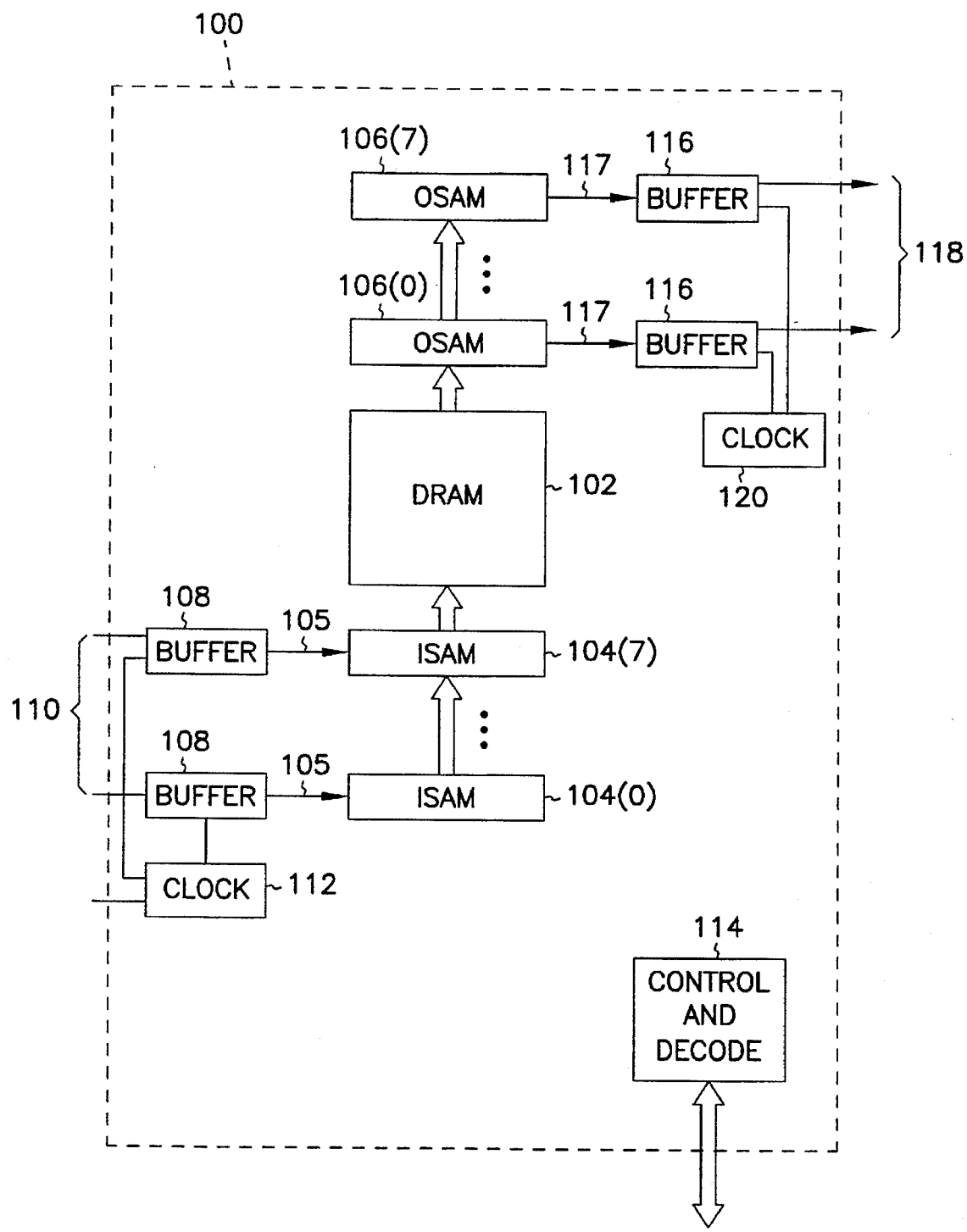
FIG. 2 is a detailed block diagram of a multi-port memory incorporating the present invention.

A detailed diagram of the multi-port memory 100 incorporating the present invention is shown in FIG. 2. The memory 100 is similar to a multiport memory described in U.S. patent application Ser. No. 08/456,520 entitled "Method and Circuit for Transferring Data with Dynamic Parity Generation and Checking Scheme in Multi-port DRAM" to Thomann et al. and incorporated herein by reference. The memory has a DRAM 102, input SAMs 104(0)–(7) and output SAMs 106(0)–(7). Each input SAM (ISAM) has a corresponding buffer circuit 108. The buffer/decode circuits 108 are used to perform several functions including latch and buffer input data, and pointer decoder and control. Input data communication bus lines 110 provide ATM package input (referred to herein as ATM cells) to the buffer circuits 108. An input frame and clock circuit 112 connected to the buffer circuits provide input clock signals to the buffer circuits 108.

Each output SAM 106 (OSAM) has a corresponding buffer circuit 116. The buffer circuit 116 is used to perform several functions including latch and buffer output data, and pointer decoder and control. Output communication bus lines 118 provide ATM cell output from buffer circuits 116. An output frame and clock circuit 120 connected to the output buffer circuits provide output clock signals to the buffer circuits 116.

ATM Data Flow

Referring to FIG. 2, in general, ATM cells flow through the buffer circuits 108 into the input serial access memory (ISAM) 104 where editing can be done by an external control function provided through the control interface 114. The external control function instructs the chip when to store ISAM cells in the DRAM 102 and when to load the output serial access memory ports (OSAM) 106 from the DRAM memory 102. The OSAMs deliver the ATM cells to output buffers 116 for dispatch. The following paragraphs describe the data flow in more detail.

ATM cells enter the chip through communication line inputs 110 to the input buffers 108. The data stream is loaded

4 into an ISAM 104 by the clock associated with the buffers over data bus 105. The input frame and clock circuit 112 is used to start the ISAM load operation. Once a complete cell has been loaded into an ISAM the data can be transferred to the DRAM.

The external controller polls an OSAM status through the control interface and command decode 114 for empty OSAMs. Once an empty OSAM 106 is detected, a DRAM read is initiated to move data stored at a DRAM row address over a read transfer bus to the OSAM. The data stream is clocked over data bus 117 to the output buffers 116 by output frame and clock circuit 120.

Figure 3:
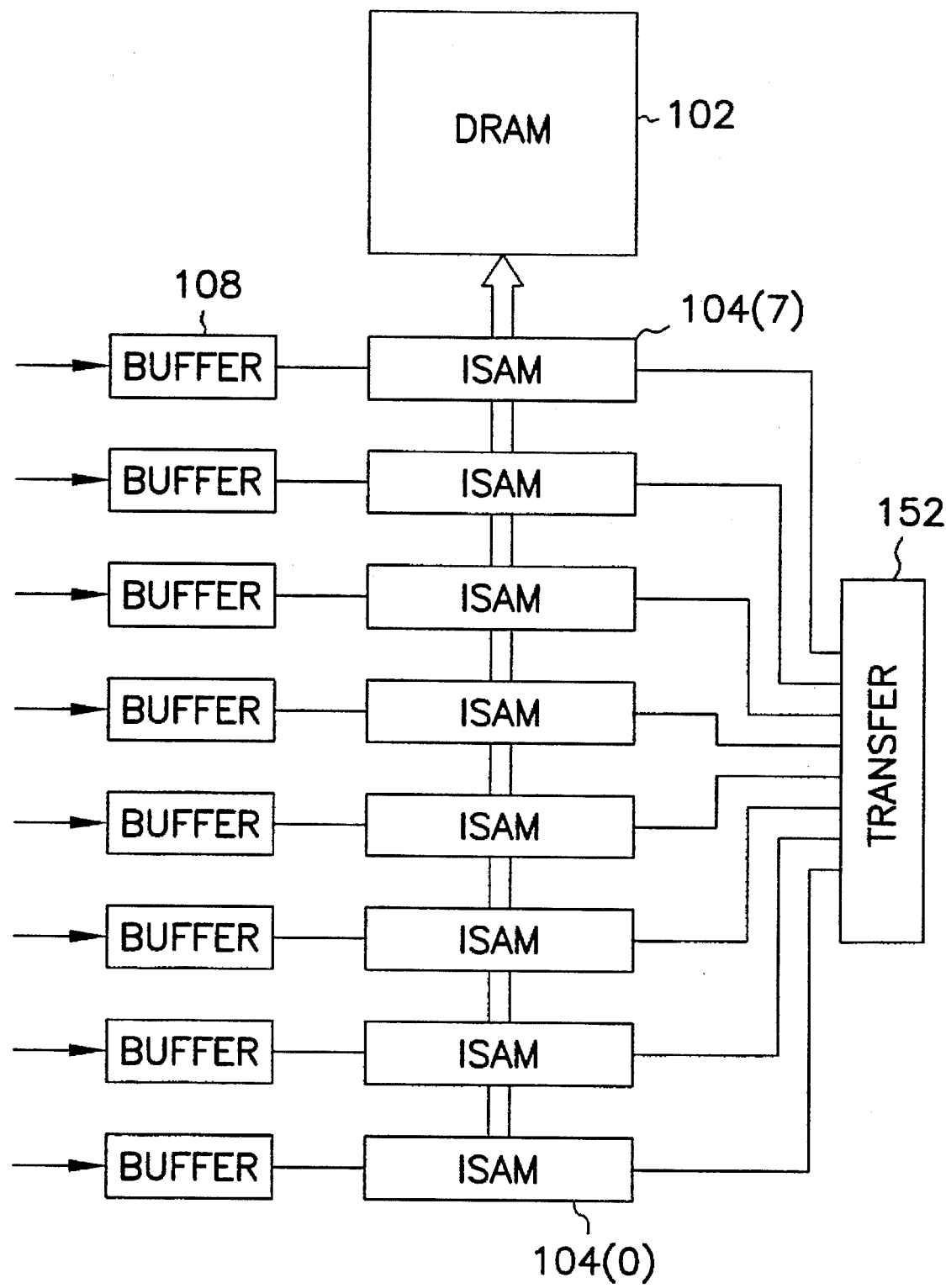
FIG. 3 is a block diagram of portions of the multiport memory of FIG. 2.

FIG. 3 illustrates a portion of the multiport memory 100 of the present invention. It will be understood that the memory circuit has been simplified to focus on the portions of the memory circuit of particular importance to the present invention and is not intended to be a complete description of all the features of the memory circuit. The memory includes dynamic random access memory (DRAM) 102 and ISAMs 104(0)–(7). Each ISAM 104 has a buffer/decode circuit 108 which provides an input buffer and a decoder circuit for "pointing" to a bit of the input SAM, as explained below. The clock circuit 112 supplies individual clock signals to the buffer circuits. The clock signals can be independent, or synchronized so that selected input buffers are clocked together. Transfer circuitry 152 is included in controller 114 to transfer data stored in the ISAMs, either independently or in combination, to the DRAM. The transfer circuit 152 controls the transfer of data from the ISAMs to the DRAM. In the simplest transfer mode one entire ISAM is transferred to one row of the DRAM. As explained below, the transfer circuit 152 can selectively transfer bits of data from several ISAMs to one row of the DRAM.

Figure 4:
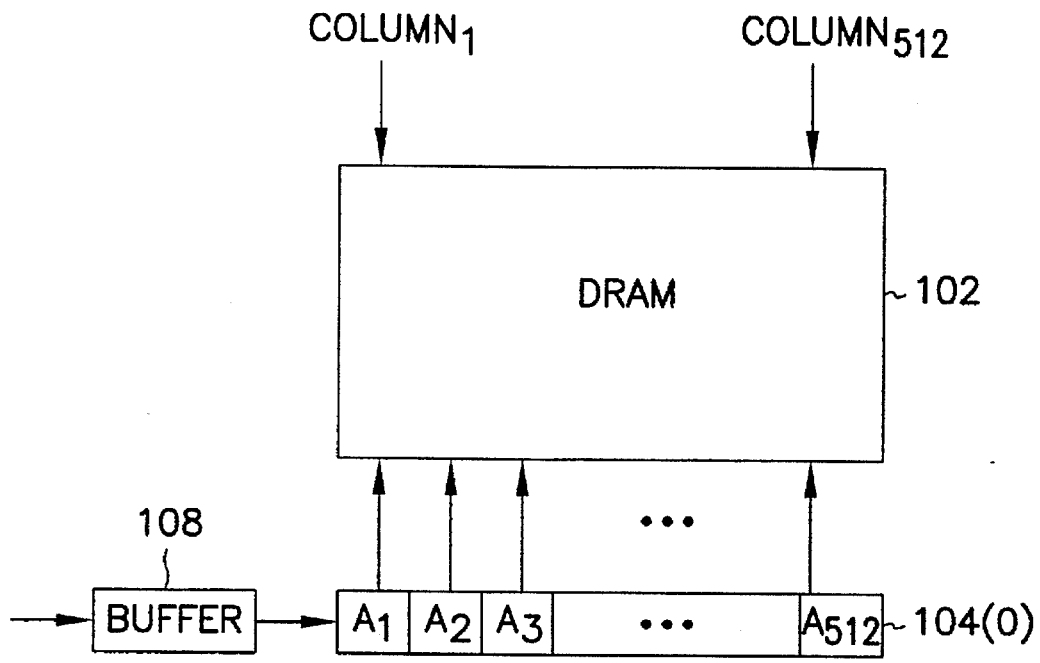
FIG. 4 is a block diagram illustrating the transfer lines between the DRAM and one of the input SAMs of the memory of FIG. 2.

Referring to FIG. 4, one of the eight ISAMs 104(0) is illustrated with the DRAM array 102. Any of the eight ISAMs can be transferred to any row of the DRAM, therefore, each of the eight SAMs are the same length as a DRAM row (512 bits). For example, ISAM A 104(0) has 512 data memory cells with bit addresses A1 to A512. In it simplest operation, one bit of data is loaded into an ISAM on each ISAM clock cycle. When all 512 bits have been loaded, the data is transferred to a row of the DRAM. From the DRAM "perspective", one ISAM "looks" like 512 bits of parallel data. The ISAMs can, therefore, store and input data package of up to 512 bits.

Figure 5:
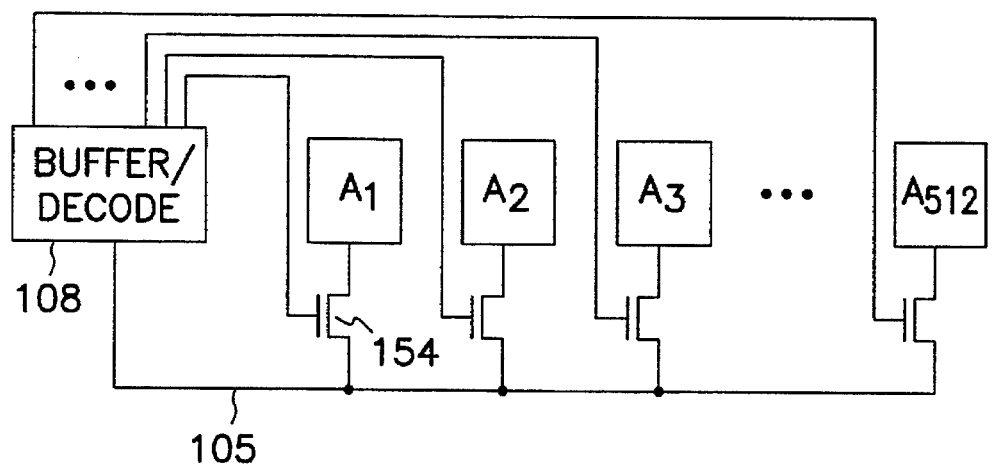
FIG. 5 is a more detailed schematic of a SAM and buffer circuit of the memory of FIG. 2.

FIG. 5 illustrates data bit addresses of ISAM A 104(0) coupled to its associated buffer circuit 108. The bit addresses of the ISAM can be selectively coupled to a data bus using access transistors 154 and the decoder of the buffer circuit 108. The decoder includes a 10 bit counter which is used to "point" to one of the 512 data bit addresses of the ISAM. To load data into an ISAM, the decode circuit 108 activates the coupling transistor 154 for an ISAM bit address based upon the state of the counter. Data contained in the buffer 108 is then stored in the ISAM bit address via the data bus 105. Control circuit 114 can be used to adjust the counter such that the ISAM is loaded starting at an address other than bit address 1. On each clock cycle the counter is incremented and a bit of data is loaded into the next ISAM address. When all 512 ISAM bits are full, the data is transferred to the DRAM and the ISAM loading operation begins again.

Figure 6:
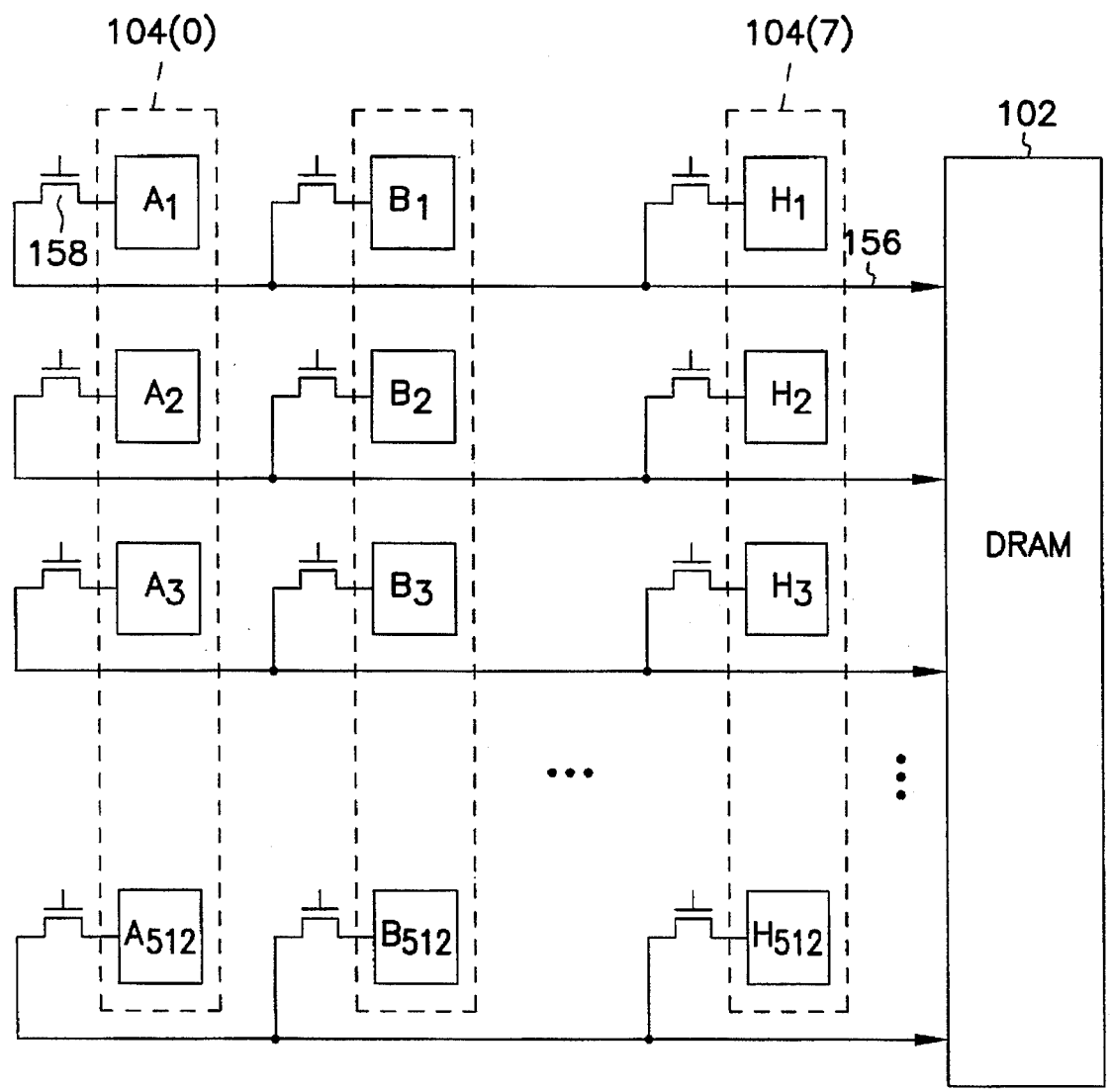
FIG. 6 is a more detailed schematic of the input SAMs and the transfer lines of the memory of FIG. 2.

FIG. 6 illustrates ISAMs A-H 104(0)–(7) coupled to the DRAM array. Transfer lines 156 are used to couple an ISAM bit to the addressed row of the DRAM. Transfer transistors 158 are used to access the ISAM data bits and couple the data to the transfer lines. The transfer circuit 152 is used to control the gate voltage of transistors 158 to selectively activate the transfer transistors so that, for example, all of the ISAMA bits can be coupled to the transfer lines to transfer the data stored in the ISAM to the DRAM. As explained below, the transfer circuit can be used to couple the ISAMs to the DRAM in a predetermined pattern such that data can be transferred to the DRAM on all 512 transfer lines 156 at once using a plurality of the ISAMs.

It will be understood that the ISAMs can be any length and are not limited to 512 bits. Further, the number of ISAMs can be varied and are not intended to be limited to eight ISAMs as described above. While the buffer circuits 108 have been described for purposes of simplicity as serially receiving one bit of data on a clock cycle, it will be understood that the buffer can receive multiple parallel bits of data on each clock cycle without departing from the present invention.

Expandable Data Width for Increased Data Rate

As explained above, data is input to an ISAM using the input buffer/decode circuit 108, and a clock 112. In operation, data is received by the input buffer and one bit of data is loaded on a clock signal into the ISAM bit identified by the pointer of the decode. Each ISAM can, therefore, load one bit on each clock cycle. A nominal cycle time for an ISAM register is approximately 20 ns. If the ISAM is configured to receive one bit on each clock, then one bit of data can be serially transmitted every 20 ns. Accordingly, if the data width (number of bits per clock) of the ISAM is increased, the data rate of the ISAM is increased by the same factor. For example, an ISAM that is designed to handle 4 bits of parallel data at a time would have a data rate of 5 ns per bit (20 ns/4 bits). The time required to load and transfer an ISAM is dependent upon its cycle time and the length of the ISAM. Assuming for an ISAM, having a one bit data width, that the cycle time is 20 ns and it has 512 data bits, the time required to load the ISAM would be 10,240 ns (20 ns per bit).

Figure 7:
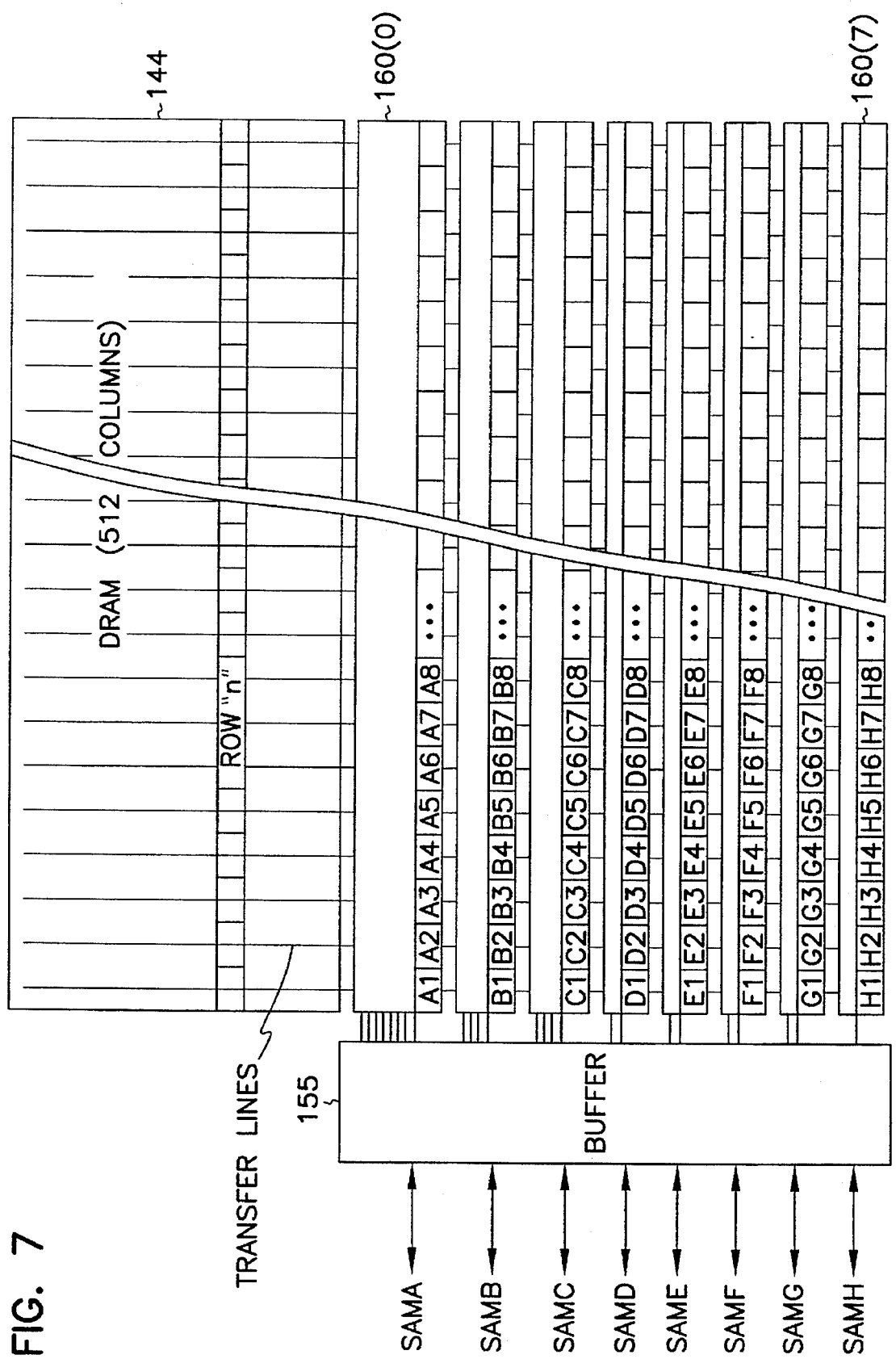
FIG. 7 is a simplified block diagram of an extended data width memory.

Several options are available to meet the need for increased input data rates while maintaining a full 512 bit transfer to the DRAM during one transfer cycle. The first option is a custom memory circuit having an expandable data width as shown in FIG. 7 where the eight data inputs 110 can be reconfigured and directed to different ISAMs. Because there are a fixed number of transfer lines between the ISAMs and the DRAM array, the ISAM must stay the same length when being reconfigured. To provide maximum data rates, one of the ISAMs needs to be laid out to handle the maximum number of data inputs (in this case 8). In order to implement all of the possible data rate configurations, one ISAM would be laid out to handle up to 8 data paths, two ISAMs would be laid out to handle up to 4 data paths each, four ISAMs would be laid out to handle up to 2 data paths each and the eighth ISAM would be laid out to handle just one data path. In operation, the memory circuit would operate in a selected mode where the input data provided on bus 110 is routed to the appropriate ISAM using an input buffer 155. This memory circuit, therefore, would allow a maximum data width of one byte of data to be loaded in an ISAM on one clock cycle.

It will be appreciated that the additional input data paths consume significantly more die area than one data path. Further, the capacitance of the data paths also increases and each ISAM is no longer characteristically the same, causing differences in operating power and speed for each ISAM. As such, this configuration is not preferred.

An alternate multiport memory increases the input data rate by changing the way each ISAM is addressed to effectively increase the data width of the ISAMs. The ISAMs can then be configured in combination to handle one, two, four or eight inputs during one clock cycle without the need to reroute the data provided on bus 110. This is accomplished by adjusting the clocks, counters and transfer circuit based upon a selected data rate operating mode. For example, referring to FIG. 8, assume four ISAMs are to be combined into one "ISAMA" that has four times the input data rate of a single ISAM. The individual clocks of each of the four ISAMs are synchronized so that each ISAM loads one data bit on each clock cycle. The first clock cycle is therefore used to load bits A1–A4 and bits A5–A8 are loaded on the next clock cycle. Alternatively, the four individual clock signals could be replaced with one master clock signal. The counters corresponding to each of the four ISAMs are also adjusted. The lower bits in each counter is set to a fixed number so that each counter increments by a pre-determined number of data bits on every clock. In the four ISAM example of FIG. 8, the lower two bits of the counter can be fixed so that the counter increments by four bits on each clock cycle. By choosing the fixed number carefully, each counter can be offset (staggered) from the other counters. To provide a multiport memory having a data rate of 5 ns (4 bits per 20 ns), the counter for ISAM 1 is not offset (lower 2 bits set to "00"), the counter for ISAM 2 is offset by one (lower 2 bits set to "01"), the counter for ISAM 3 is offset by two (lower 2 bits set to "10"), and the counter for ISAM 4 is offset by three (lower 2 bits set to "11"). As shown in FIG. 8, each ISAM starts at a different bit and increments four data bits on each clock cycle. Every fourth data bit in each ISAM, therefore, is used to make up the final "ISAM".

The transfer circuit 152 controls the transfer of data from the ISAMs based upon the operating mode selected. After 512 bits of data have been loaded into the ISAMs, the 128 occupied data bits of each of the four ISAMs must be transferred at one time to the DRAM (512 bit transfer). To make four ISAMs appear like one ISAM to the DRAM: data bits 1, 5, 9, 13 . . . from ISAM 104(0) are transferred; data bits 2, 6, 10, 14 . . . from ISAM 104(2) are transferred; data bits 3, 7, 11, 15 . . . from ISAM 104(3) are transferred; and data bits 4, 8, 12, 16 . . . from ISAM 104(4) are transferred. This can be accomplished with a decode function built into the transfer circuit 152. That is, the transfer transistors 158 illustrated in FIG. 6 can be controlled using the transfer circuit such that the transfer transistor for each of the occupied ISAM data bits is activated and the data stored therein is coupled to one of the 512 transfer lines 156. The above described memory circuit transfers 512 bits of data in one transfer cycle, but loaded the input data at four times the rate available using one ISAM. The input bus 110, therefore, does not need to be re-routed to accommodate increased data rates, but can remain coupled to one ISAM.

The memory circuit is intended to be flexible such that it can be used in a variety of different data rate systems. That is, the ISAMs can be configured to operate independently such that one bit of an ATM cell is input on each clock cycle, see FIG. 9, used to double the data rate as shown in FIG. 10, or used in combination to allow an entire byte of an ATM cell to be loaded on each clock cycle, as seen in FIG. 11. While the mode of the memory circuit can be quickly changed using the control circuit 114 to operate at different data rates as required by different applications, it is anticipated that for a given application the memory circuit will operate in one mode.

It will be understood that although ATM cells are currently a fixed length, the length of the ISAMs used in the present invention is not limited to 512 bits as described herein. Further, additional ISAMs can be included in the present memory circuit to further increase the operating data rates. Although input SAMs have been used to describe the present invention, it will be understood that output SAMs (OSAM) can be used to increase the data width and speed the transfer of data from the RAM to the OSAM. FIGS. 7–11 illustrate SAMs which can be used as both input and output SAMs.

Conclusion

A multiport memory has been described which has a DRAM array, input SAMs, and output SAMs. The SAMs each have one or more dedicated input/output data lines for receiving/transmitting external data communications. This data can be any type of data communications, but the memory is particularly well suited for ATM data cells. Circuitry is included in the memory to allow the memory to be operated in a number of different data width modes. The OSAMs or ISAMs are used in combination, depending upon the data width mode selected, to store output or input data. Each SAM stores a fraction of the full data communication, or ATM cell.

The portions of each ISAM which contain the ATM cell are then selectively transferred to the DRAM array. The memory, therefore, allows the ISAMs to be configured as "one" ISAM having an expandable data width. The data rate of the memory is adjustable by selecting the data rate mode, while maintaining a full ATM cell transfer from the ISAMs to the DRAM on one transfer cycle.

The DRAM can transfer a full ATM cell to the OSAMs such that each OSAM stores a portion of the ATM cell. The OSAMs are, therefore, configured as "one" OSAM having an expandable data width.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, although the memory described has eight ISAMs, any number of ISAMs could be used. In addition, DRAM 102 can be replaced with other memories, such as a static RAM. Further, the staggered pattern of configuring the ISAMs is merely one way of configuring the ISAMs. Those skilled in the art can recognize that any pattern can be used to configure the ISAMs so that an input data communication is stored in a plurality of ISAMs. Therefore, it is manifestly intended that this invention be limited only by the claims and the equivalents thereof.

What is claimed is:

1. A method of operating a multiport memory comprising a random access memory (RAM) array and N serial access memories (SAMs), each SAM having a maximum storage capacity of a full data package, the method comprising the steps of:

selecting a data width mode using a controller of the multiport memory; and configuring the N SAMs so that each SAM stores a portion of a full data package, and wherein the portion of a data package is 1/N of the data package; and storing N bits of the data package in the N SAMs on one clock signal.

2. The method of claim 1 further including transferring the portions of the data package from the plurality of SAMs to the RAM in one transfer cycle.

3. The method of claim 1 further including transferring the portions of the data package from the RAM to the plurality of SAMs in one transfer cycle.

4. A method of storing a data package in a multiport memory comprising a random access memory (RAM) array and a plurality of serial access memories (SAMs), each SAM having a maximum storage capacity of a full data package, the method comprising the steps of:

selecting a data width mode using a controller of the multiport memory;

configuring the plurality of SAMs so that each SAM stores a portion of a full data package;

storing a portion of the data package in each of the plurality of SAMs; and transferring the portions of the data package from the plurality of SAMs to the RAM in one transfer cycle.

5. A multiport memory circuit comprising:

an array of memory cells arranged in X rows and Y columns;

serial access memories coupled to the array of memory cells, each serial access memory having Y data storage locations corresponding to the columns in the array of memory cells such that each serial access memory can store Y bits of data; and a controller for configuring the serial access memories to store less than Y bits of data.

6. A method of transferring data from a plurality of serial access memories to a random access memory, the random access memory having memory cells arranged in rows and columns, and the plurality of serial access memories having memory cells capable of storing an entire row of data to be stored in the random access memory, the method comprising the steps of:

configuring the plurality of serial access memories to store an entire row of data in the random access memory, such that each serial access memory stores a portion of the entire row of data; and transferring an entire row of data from the plurality of serial access memories to the random access memory.

7. A method of operating a multiport memory having Y X-bit wide serial memories, the method comprising the steps of:

receiving an X-bit data package with the multiport memory in X/Y clock cycles;

storing the X-bit data package in the Y X-bit wide serial memories such that each of the serial memories stores X/Y bits of data; and transferring the X-bit data package to a memory array in one clock cycle.

8. The method of claim 7 further comprising the steps of:

transferring the X-bit data package from the memory array to the Y X-bit wide serial memories in one clock cycle;

storing the X-bit data package in the Y X-bit wide serial memories such that each of the serial memories stores X/Y bits of data; and outputting the X-bit data package from the multiport memory in X/Y clock cycles.

* * * * *